(12) United States Patent
Librizzi

(10) Patent No.: US 8,793,087 B2
(45) Date of Patent: Jul. 29, 2014

(54) MODULAR DEVICE FOR PROTECTING AND MONITORING A BATTERY

(75) Inventor: Fabrizio Librizzi, Catania (IT)

(73) Assignee: STMicroelectronics S.R.L., Milan (IT)

( * ) Notice: Subject to any disclaimer, the term of this patent is extended or adjusted under 35 U.S.C. 154(b) by 394 days.

(21) Appl. No.: 13/238,238

(22) Filed: Sep. 21, 2011

(65) Prior Publication Data

US 2012/0089352 A1 Apr. 12, 2012

(30) Foreign Application Priority Data

Oct. 8, 2010 (IT) .............................. MI2010A1835

(51) Int. Cl.
*G01R 31/36* (2006.01)
*H02J 7/00* (2006.01)

(52) U.S. Cl.
CPC ........... *H02J 7/0021* (2013.01); *G01R 31/3658* (2013.01); *H02J 7/0014* (2013.01)
USPC .......... 702/63; 320/116; 324/522; 340/636.1; 340/636.15; 340/636.18

(58) Field of Classification Search
USPC .......... 702/63; 320/116; 324/522; 340/636.1, 340/636.15, 636.18
See application file for complete search history.

(56) References Cited

U.S. PATENT DOCUMENTS

| | | | |
|---|---|---|---|
| 2004/0199343 A1 | 10/2004 | Cardinal | |
| 2007/0268000 A1* | 11/2007 | Kobayashi et al. | 320/118 |
| 2008/0143543 A1* | 6/2008 | Vandensande et al. | 340/636.1 |
| 2008/0238432 A1* | 10/2008 | Botker et al. | 324/434 |
| 2010/0173180 A1 | 7/2010 | Li | |
| 2010/0268492 A1* | 10/2010 | Matsuura | 702/63 |
| 2010/0327806 A1* | 12/2010 | Brisebois | 320/116 |
| 2011/0004427 A1* | 1/2011 | Gorbold et al. | 702/63 |
| 2011/0068719 A1* | 3/2011 | Oya | 318/139 |
| 2011/0071781 A1* | 3/2011 | Akahane et al. | 702/63 |

FOREIGN PATENT DOCUMENTS

WO WO 2009/091349 7/2009

OTHER PUBLICATIONS

"SBS1.1-Compliant Gas Gauge and Protection Enabled with Impedance Track™", Texas Instruments, www.ti.com, SLUS757B, Jul. 1, 2007.
Italian Patent Office Search Report for IT Appl MI20101835, Jun. 24, 2011.

* cited by examiner

*Primary Examiner* — Mohamed Charioui
*Assistant Examiner* — John Kuan
(74) *Attorney, Agent, or Firm* — Leveque IP Law, P.C.

(57) ABSTRACT

A modular device having at least one master integrated circuit, and one or more slave integrated circuit modules coupled to the at least one master integrated circuit with each slave integrated circuit module of the one or more slave integrated circuit modules coupled to and associated with only a single cell of the battery. Each slave integrated circuit module of the one or more slave integrated circuit modules further comprises: detection circuitry adapted to detect data comprising one or more of the temperature, voltage or charge status, and malfunctioning of the single cell associated with and monitored by the slave integrated circuit; and an interface operable to send said detected data to the at least one master integrated circuit. The at least one master integrated circuit is adapted to send commands to a slave integrated circuit module in response to the detected data detected by the slave integrated circuit module.

19 Claims, 3 Drawing Sheets

MODULAR DEVICE FOR PROTECTING AND MONITORING A BATTERY

PRIORITY CLAIM

This application claims benefit of foreign priority in accordance with 35 U.S.C. 119(b) to Italian application No. MI 2010A 001835 filed Oct. 8, 2010.

BACKGROUND

Using batteries, such as lithium batteries, is known in electronic devices such as mobile phones, hand-held devices, notebooks, etc. Lithium batteries should be conveniently managed to avoid malfunctioning and damage that may also lead to battery explosion. For these reasons, batteries are equipped with integrated circuits that measure charge, voltage, temperature, and protect the battery from being damaged.

The batteries used for electronic devices typically comprise a plurality of cells connected in series and one or two integrated circuits that perform measuring and protecting operations. In general, when two integrated circuits are used, one is responsible for measurement operations and the other operates to send out communications that contain indications on the battery capacity or on malfunctioning, and is capable of making decisions concerning battery malfunctioning or other information.

Integrated circuits currently existing in the market are only for batteries with a defined number of cells, e.g. 12 or multiples of 12. If a battery with 8 cells is used, integrated circuits set up for a battery with 12 cells are required; thereby, the final device or "battery pack" is not optimized in terms of cost/performance ratio.

Another integrated circuit in battery packs currently being used is configured to protect the battery cells if the voltage of the cells exceeds or decreases below certain levels.

Firmware implemented in the integrated circuits of the battery packs comprises the functions of determining the beginning of the charge, activating the function of cell balancing, and estimating the lifetime of the battery pack. Such firmware is stored inside the integrated circuits and may not be modified as it is not accessible to the user. Therefore, particular battery management algorithms may not be inserted into the integrated circuits, such as for example, management algorithms related to the high safety of the battery or for the balancing function of the cells known as "cell balancing". Cell balancing is of interest due to the cells not all having the same, but having different, capacities due to manufacturing tolerances. To allow all the cells of a battery to be charged to the same level, a greater amount (or percentage) of current is required to be directed towards some cells and a smaller amount towards others; this requires a higher charge time.

Document "SBS 1.1-Compliant gas gauge and protection enabled with impedance track" SLUS757B-JULY 2007-REVISED APRIL 2008, Texas Instruments, describes a single integrated circuit adapted to operate the monitoring and protecting functions for batteries of Lithium-ion (Li-ion) or Lithium-polymer (Li-polymer) type, for example.

In view of the state of the art, it is desired to provide a modular device for protecting and monitoring a battery that is different from those known in the art.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
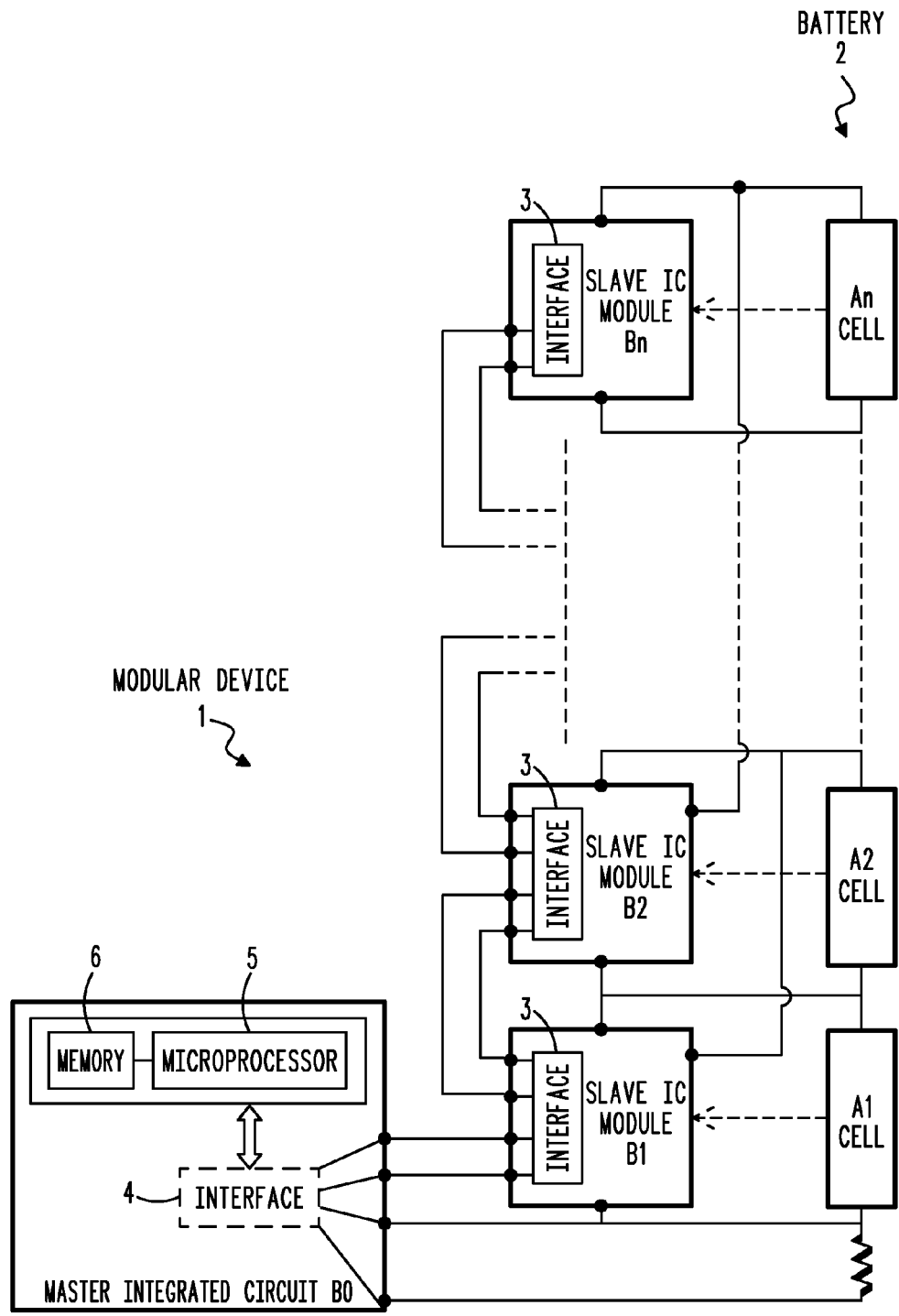
FIG. 1 shows a circuit scheme of a modular device for protecting and monitoring a battery, in accordance with various embodiments.

Before describing in detail embodiments that are in accordance with the present invention, it should be observed that the embodiments reside primarily in combinations of method steps and apparatus components related to touch and multi-touch sensing interfaces for electronic devices. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may comprise MEMS devices, mechanical structures and one or more conventional processors and unique stored program instructions of software and/or firmware programs that control the one or more processors to implement, in conjunction with certain non-processor circuits, some, most, or all of the functions of touch and multi-touch sensing described herein. Other non-processor circuits may include, but are not limited to signal drivers, clock circuits, power source circuits, and user input devices. As such, these functions may be interpreted as a method to perform touch and multi-touch sensing interfaces for electronic devices. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs, ICs and mechanical structures with minimal experimentation.

In accordance with various embodiments presented herein, a modular device for protecting and monitoring a battery having one or more cells is presented. The modular device comprises at least one master integrated circuit and one or more slave integrated circuit modules, with each slave integrated circuit module of the one or more slave integrated circuit modules associated with a single cell of the battery and each slave integrated circuit module of the one or more slave integrated circuit modules further comprising detection circuitry adapted to detect data comprising one or more of the temperature, voltage or charge status, and malfunctioning of the single cell associated with and monitored by the slave integrated circuit; and an interface operable to send said detected data to the at least one master integrated circuit. The at least one master integrated circuit is adapted to send commands to a slave integrated circuit module in response to the detected data detected by the slave integrated circuit module.

In accordance with further embodiments, a slave integrated circuit module for protecting and monitoring a cell of a battery comprises: a detection element adapted to detect data comprising one or more of temperature, voltage or charge status, and malfunctioning of a single cell associated with the slave integrated circuit module, wherein the slave integrated circuit module monitors and detects said data only for the single cell associated with the slave integrated circuit module; and an interface to which the detection is coupled that is adapted to send said detected data to an at least one master integrated circuit. If the slave integrated circuit module is a first slave integrated circuit module of a plurality of slave integrated circuit modules, the interface of the slave integrated circuit module sends its said detected data directly to the at least one master integrated circuit. If the slave integrated circuit module is not the first slave integrated circuit module of a plurality of slave integrated circuit modules, the interface of the slave integrated circuit module sends its said detected data to the first slave integrated circuit module for delivery of the detected data by the first slave integrated circuit module to the at least one master integrated circuit.

With reference to FIG. 1, a circuit scheme of a modular device 1 for protecting and monitoring a battery 2 in accordance with various embodiments is shown; the apparatus comprising modular device 1 and battery 2 forms a "battery pack". Battery 2 comprises at least one cell A1 but may comprise a plurality of cells A1 . . . An as shown. Modular device 1 comprises a master integrated circuit B0 and at least one slave integrated circuit module B1 coupled to it. In the embodiment shown in FIG. 1, a plurality of slave integrated circuit modules B1 . . . Bn are shown, in which each of the slave integrated circuit modules B1 . . . Bn is coupled to a respective and associated cell A1 . . . An of the battery 2 in a one-to-one relationship. Thereby, modular device 1 is adaptable to any battery 2, i.e. the number of slave integrated circuit modules B1 . . . Bn may be increased or decreased according to the number of cells A1 . . . An of battery 2, providing a one-to-one correspondence or association between a given cell and its associated slave integrated circuit module Bn. The slave integrated circuit modules B1 . . . Bn may be identical to one another.

The slave integrated circuit modules B1 . . . Bn are arranged in linear sequence from the first slave integrated circuit module B1 to the last slave integrated circuit module Bn as shown.

An interface 3 is present in each slave integrated circuit module Bi of the slave integrated circuit modules B1 . . . Bn, and interface 3 is adapted to allow each slave integrated circuit module to be coupled to the next slave integrated circuit module and to the preceding slave integrated circuit module in the sequence of slave integrated circuit modules B1 . . . Bn, as shown in FIG. 1. The first slave integrated circuit module B1 in the sequence of slave integrated circuit modules B1 . . . Bn is coupled to the next or second slave integrated circuit module B2 and to the master integrated circuit B0.

The slave integrated circuit modules B1 . . . Bn transmit information, such as digital signals, detected from monitoring cells A1 . . . An of battery 2 to the master integrated circuit B0, i.e. information on the cell temperature, cell voltage or charge status, cell malfunctioning and other information. Being coupled in sequence with one another, the slave integrated circuit modules B1 . . . Bn transmit the detected data to one another, with only the first slave integrated circuit module B1 transmitting the detected data to the master integrated circuit B0.

The master integrated circuit B0 comprises an interface 4 adapted to receive the data sent by the first slave integrated circuit module B1 and further comprises a microprocessor 5 with a memory 6 where software or firmware may be installed and the instructions of a stored software or firmware program available for execution by the microprocessor 5. Microprocessor 5 is adapted to manage the monitoring of battery 2, the protection of the cells Ai . . . An, the alarm indicators, etc. The software or firmware for managing the data detected by the slave integrated circuit modules B1 . . . Bn is adaptable to the number of slave integrated circuit modules B1 . . . Bn. As stated previously, there is a one-to-one correspondence between a slave integrated circuit module and its associated cell that it monitors to detect data of interest. Therefore, the modular device 1 is adaptable to a battery 2 having any number of cells. The number of slave integrated circuit modules B1 . . . Bn may be increased or decreased according to the number of cells A1 . . . An of battery 2 to provide the one-to-one relationship between slave integrated circuit module and batter cell.

Figure 2:
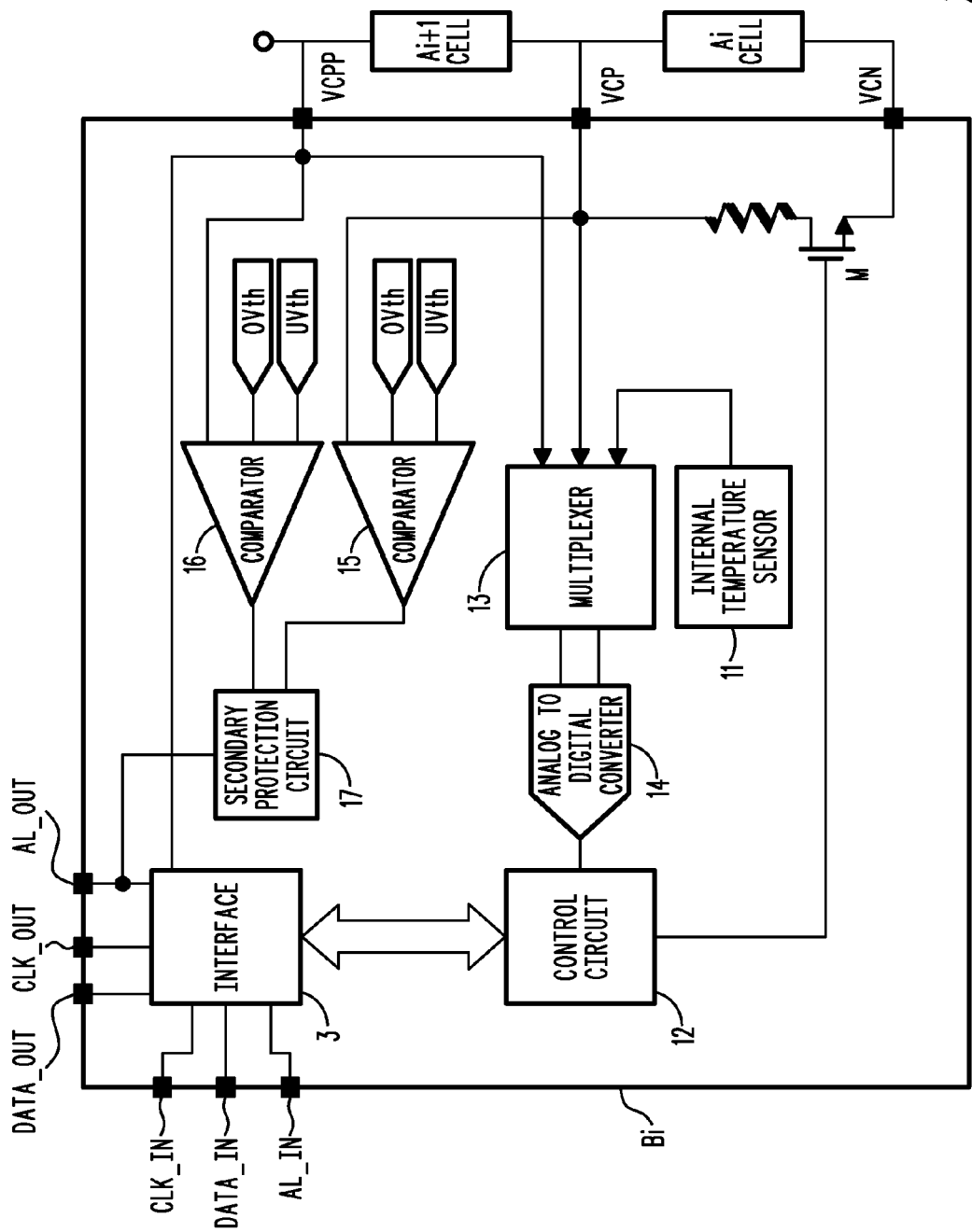
FIG. 2 shows a circuit scheme of a slave integrated circuit module belonging to the modular device of FIG. 1, in accordance with various embodiments.
Figure 3:
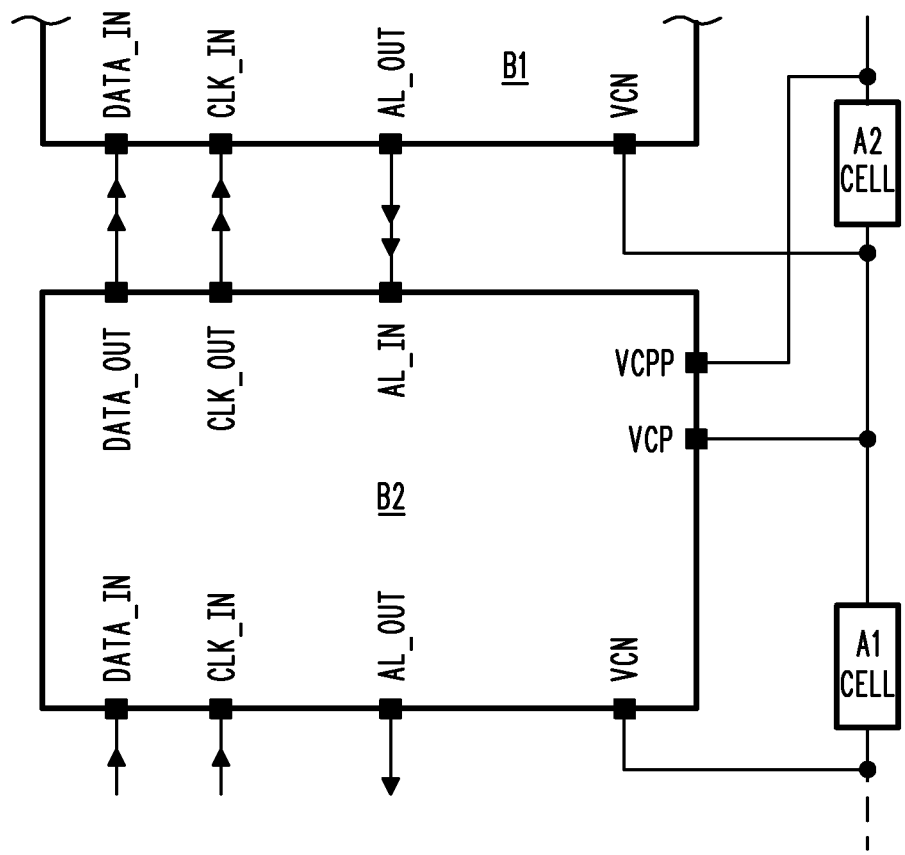
FIG. 3 shows a circuit scheme of two slave integrated circuit modules in FIG. 2, coupled to each other, in accordance with various embodiments.

Each slave integrated circuit module Bi of the slave integrated circuit modules B1 . . . Bn has detection circuitry, comprised of elements 11-17 of FIG. 2, in certain exemplary embodiments, that is operable to detect conditions related to temperature, and/or voltage or charge status, and/or malfunctioning of the particular cell that is monitored by a particular slave integrated circuit module, in the one-to-one slave integrated circuit module-to-battery cell relationship previously described. As shown in FIGS. 2 and 3, each slave integrated circuit module Bi for i=1, . . . n of the slave integrated circuit modules B1 . . . Bn comprises an internal temperature sensor 11 capable of estimating the temperature Ti of the cell Ai for i=1, . . . n of the cells A1 . . . An with which the slave integrated circuit module Bi is associated. The detected temperature Ti may not exactly correspond to that of the monitored cell Ai if the slave integrated circuit module Bi is performing the function of cell balancing, which leads to an increase of the temperature of the slave integrated circuit module Bi; this cell balancing function is controlled by a control circuitry 12 of the slave integrated circuit module Bi.

A VCP input terminal electrically coupled to the associated cell Ai is provided for supplying the voltage value Vi of the associated cell.

A VCPP input terminal electrically coupled with the cell Ai+1 is also provided for supplying the voltage value Vi+1 of the cell Ai+1.

The voltage Vi and the value Vt of the temperature sensor are inputted into a multiplexer 13, which selects the signal inputted to an analog-digital converter 14, such as a 10-bit converter, for example. The converter 14 is adapted to send the converted digital signals to the control circuitry 12.

There are also two comparators 15 and 16 adapted to compare the voltage Vi at the VCP input and the voltage Vi+1 at the VCPP input with the high voltage threshold OVth and the low voltage threshold UVth, respectively. The outputs of comparators 15 and 16 supply a secondary protection circuit 17 adapted to send a signal representative of the malfunctioning of cell Ai to the output terminal AL_OUT if the voltage Vi is lower than the value UVth or higher than the value OVth.

Each slave integrated circuit module Bi may also comprise a transistor, such as MOSFET M, adapted to implement the function of cell balancing. The transistor M has the drain terminal coupled with the VCP input terminal, the gate terminal controlled by the control circuitry 12, and the source terminal coupled to a VCN terminal of the slave integrated circuit module Bi coupled to the associated cell Ai to supply a current Ii to the cell Ai used for reaching the set charge value of cell Ai.

Interface 3 sends the monitored or detected data from the slave integrated circuit module Bi through the output terminal DATA_OUT to the preceding slave integrated circuit module Bi−1 to which slave integrated circuit module Bi is coupled, in the case of a slave integrated circuit module Bi that is not the first slave integrated circuit module, or to the master circuit B0; the same interface 3 receives the monitored or detected data from the next slave integrated circuit module Bi+1 and from other slave integrated circuit modules Bi+2 . . . Bn through the input terminal DATA_IN. The same interface 3 receives and sends synchronization signals through the input CLK_IN and output CLK_OUT with the interfaces 3 of the other slave integrated circuit modules as needed and with the master integrated circuit for synchronously sending data from a slave integrated circuit module Bi to the preceding slave integrated circuit module Bi−1 in the sequence of slave integrated circuit modules B1 . . . Bn or to the master integrated circuit B0.

Interface 3 of the slave integrated circuit module Bi receives the malfunctioning signal from another slave integrated circuit module Bi+1 . . . Bn through the input AL_IN and sends the malfunctioning signals received or its own malfunctioning signal detected, through the output AL_OUT. In the embodiment of FIG. 3, slave integrated circuit module B1 would receive a malfunctioning signal, if present, from slave integrated circuit module B2 as shown.

Therefore, the data detected by the last slave integrated circuit module Bn in the sequence of slave integrated circuit modules B1 . . . Bn are communicated to the first slave integrated circuit module B1 through the chain of slave integrated circuit modules B1+1 . . . Bn−1 and the first slave integrated circuit module B1 communicates said data to the master integrated circuit B0.

Interface 3 thus has the task of implementing the communication protocol provided between the slave integrated circuit modules B1 . . . Bn, performing a level translation for the signals to arrive at the slave integrated circuit Bi with the correct voltage levels, and then correctly communicating with the master integrated circuit B0. For this purpose, interface 3 receives the input voltages Vi and Vi+1 which will be the low and high reference voltages for the signals to be sent to the DATA_OUT and CLK_OUT terminals.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A modular device for protecting and monitoring a battery, said battery having a plurality of cells, the modular device comprising:
   at least one master integrated circuit; and
   a sequence of slave integrated circuit modules coupled to the at least one master integrated circuit with each slave integrated circuit module of the sequence of slave integrated circuit modules configured to couple to and be associated with a cell of the plurality of cells of the battery and with each slave integrated circuit module of the sequence of slave integrated circuit modules comprising:
      detection circuitry adapted to detect data comprising one or more of the temperature, voltage or charge status, and malfunctioning of a first cell of the plurality of cells;
      a VCN input terminal operable to electrically couple to the first cell of the plurality of cells to provide a first voltage value corresponding to a negative voltage value of the first cell;
      a VCP input terminal operable to electrically couple to the first cell of the plurality of cells to provide a second voltage value corresponding to a positive voltage value of the first cell and a negative voltage value of an adjacent cell of the plurality of cells, enabling the voltage of the first cell to be monitored by the first slave integrated circuit;
      a VCPP input terminal operable to electrically couple with the adjacent cell of the plurality of cells to provide a third voltage value corresponding to a positive voltage value of the adjacent cell;
      and
      an interface operable to send said detected data to the at least one master integrated circuit and operable to exchange detected data with an adjacent slave integrated circuit module associated with the adjacent cell in the plurality of cells, wherein the interface receives the second and third voltage values and wherein the second and third voltage values provide low and high reference voltages for signals exchanged with the adjacent slave integrated circuit module,
   wherein said at least one master integrated circuit is adapted to send commands to a slave integrated circuit module in response to the detected data comprising one or more of the temperature, voltage or charge status, and malfunctioning detected by the slave integrated circuit module.

2. A modular device according to claim 1, wherein the interface of each slave integrated circuit module of the sequence of slave integrated circuit modules is configured to provide its detected data to the at least one master integrated circuit either directly or through another slave integrated circuit module of the sequence of slave integrated circuit modules, wherein the another slave integrated circuit module is associated with and configured to monitor another battery cell of the plurality of cells.

3. A modular device according to claim 2, wherein a first interface of a first slave integrated circuit module of the sequence of slave integrated circuit modules is configured to exchange detected data with said master integrated circuit and with a next slave integrated circuit module in the sequence of slave integrated circuit modules to which the first slave integrated circuit module is coupled, and with the interface of every other slave integrated circuit module in the sequence of slave integrated circuit modules configured to exchange detected data with a preceding slave integrated circuit module and with a next slave integrated circuit module in the sequence of slave integrated circuit modules.

4. A modular device according to claim 3, wherein said sequence of slave integrated circuit modules is configured so that the data detected by a last slave integrated circuit module in the sequence of slave integrated circuit modules are communicated to the first slave integrated circuit module through the chain of intermediate slave integrated circuit modules of the sequence of slave integrated circuit modules and the first slave integrated circuit module communicates said data detected by the last slave integrated circuit module to the master integrated circuit.

5. A modular device according to claim 3, wherein the interface of each slave integrated circuit module in the sequence of slave integrated circuit modules is configured to synchronize with the other interfaces of the slave integrated circuit modules and with the master integrated circuit to synchronously send data from a slave integrated circuit module to a preceding slave integrated circuit module in the sequence of slave integrated circuit modules that precedes the slave integrated circuit module or to the master integrated circuit.

6. A modular device according to claim 1, wherein said master integrated circuit comprises a microprocessor and a memory where software is installed and is executable by the microprocessor to manage the data detected by the slave integrated circuit modules, said software being adaptable to the number of slave integrated circuit modules of the sequence of salve integrated circuit modules.

7. A modular device according to claim 1, wherein two or more slave integrated circuit modules of said sequence of salve integrated circuit modules are identical to one another.

8. A modular device according to claim 1, wherein the modular device together with the battery having one or more cells comprises a battery pack.

9. A slave integrated circuit module for protecting and monitoring a cell of a plurality of cells of a battery, comprising:
a detection element adapted to detect data comprising one or more of temperature, voltage or charge status, and malfunctioning of a first cell associated with the slave integrated circuit module;
a VCN input terminal operable to electrically couple to the first cell of the plurality of cells to provide a first voltage value corresponding to a negative voltage value of the first cell;
a VCP input terminal operable to electrically couple to the first cell of the plurality of cells to provide a second voltage value corresponding to a positive voltage value of the first cell and a negative voltage value of an adjacent cell of the plurality of cells, enabling the voltage of the first cell to be monitored by the first slave integrated circuit;
a VCPP input terminal operable to electrically couple with the adjacent cell of the plurality of cells to provide a third voltage value corresponding to a positive voltage value of the adjacent cell;
and
an interface, to which the detection element is coupled, that is adapted to send said detected data to an at least one master integrated circuit, and operable to exchange detected data with an adjacent slave integrated circuit module associated with the adjacent cell in the plurality of cells, wherein the interface receives the second and third voltage values and wherein the second and third voltage values provide low and high reference voltages for signals exchanged with the adjacent slave integrated circuit module,
wherein if the slave integrated circuit module is a first slave integrated circuit module of a plurality of slave integrated circuit modules, the interface of the slave integrated circuit module sends its said detected data directly to the at least one master integrated circuit, and
if the slave integrated circuit module is not the first slave integrated circuit module of a plurality of slave integrated circuit modules, the interface of the slave integrated circuit module sends its said detected data to the first slave integrated circuit module for delivery of the detected data by the first slave integrated circuit module to the at least one master integrated circuit.

10. A slave integrated circuit module according to claim 9, wherein the interface of the slave integrated circuit module is configured to exchange data with another slave integrated circuit module in a sequence of slave integrated circuit modules to which the slave integrated circuit module is coupled, the another slave integrated circuit module associated with another cell separate from the single cell associated with the slave integrated circuit module.

11. A slave integrated circuit module according to claim 9, wherein the slave integrated circuit module is a first slave integrated circuit module of a sequence of slave integrated circuit modules and the interface of the slave integrated circuit module is configured to send the data detected by the detection element of the slave integrated circuit module to the at least one master integrated circuit and to exchange detected data with a next slave integrated circuit module in the sequence of slave integrated circuit modules that is coupled to the slave integrated circuit module.

12. A slave integrated circuit module according to claim 11, wherein the first slave integrated circuit is further configured to send detected data received from the next slave integrated circuit module in the sequence of slave integrated circuit modules to the at least one master integrated circuit.

13. A slave integrated circuit module according to claim 12, wherein the detected data received from the next slave integrated circuit module comprises data detected by one or more of the next slave integrated circuit module and one or more slave integrated circuit modules of the sequence of slave integrated circuit modules other than the next slave integrated circuit module.

14. A slave integrated circuit module according to claim 9, wherein the slave integrated circuit module is not a first slave integrated circuit module of a sequence of slave integrated circuit modules and the interface of the slave integrated circuit module is configured to send the data detected by the detection element of the slave integrated circuit module to a next slave integrated circuit module in the sequence of slave integrated circuit modules to which the slave integrated circuit module is coupled for delivery of the detected data to the at least one master integrated circuit.

15. A slave integrated circuit module according to claim 14, wherein the next slave integrated circuit module is the first slave integrated circuit module.

16. A slave integrated circuit module according to claim 14, wherein the slave integrated circuit module is not a first slave integrated circuit module and the slave integrated circuit module and the next slave integrated circuit module are intermediate slave integrated circuit modules of the sequence of slave integrated circuit modules and coupled to the first slave integrated circuit module of the sequence of slave integrated circuit modules.

17. A slave integrated circuit module according to claim 9, wherein the slave integrated circuit module is a last slave integrated circuit module of the sequence of slave integrated circuit modules and the interface of the slave integrated circuit module is configured to send data detected by the detection element of the slave integrated circuit module to a first slave integrated circuit module through a chain of intermediate slave integrated circuit modules of the sequence of slave integrated circuit modules, the first slave integrated circuit module configured to send the detected data to the at least one master integrated circuit.

18. A slave integrated circuit module according to claim 9, wherein the interface of the slave integrated circuit module is configured to synchronize with the interface of a preceding slave integrated circuit module that precedes the slave integrated circuit module in a sequence of slave integrated circuit modules to which the slave integrated circuit module is coupled and with the at least one master integrated circuit to synchronously send data from the slave integrated circuit module to the preceding slave integrated circuit module or to the master integrated circuit.

19. A slave integrated circuit module according to claim 9, further comprising:
    a secondary protection circuit responsive to the second and third voltage values, the second protection circuit configured to send a signal representative of a malfunctioning cell to an output terminal when one or more of the second and third voltage values is less than a low voltage threshold, UVth, or greater than an high voltage threshold OVth.

* * * * *